United States Patent [19]

Lewis et al.

[11] Patent Number: 4,822,722
[45] Date of Patent: Apr. 18, 1989

[54] PROCESS OF USING HIGH CONTRAST PHOTORESIST DEVELOPER WITH ENHANCED SENSITIVITY TO FORM POSITIVE RESIST IMAGE

[75] Inventors: James M. Lewis, Williamsville; Robert A. Owens, E. Amherst; Susan A. Ferguson, W. Seneca; Roland L. Chin, Williamsville; Valentine T. Zuba, Hamburg, all of N.Y.

[73] Assignee: Petrarch Systems, Inc., Bristol, Pa.

[21] Appl. No.: 119,295

[22] Filed: Nov. 6, 1987

Related U.S. Application Data

[63] Continuation of Ser. No. 756,206, Jul. 18, 1985, abandoned.

[51] Int. Cl.$^4$ .............................................. G03F 7/26
[52] U.S. Cl. .................................... 430/326; 430/302; 430/309
[58] Field of Search .................... 430/326, 309, 302

[56] References Cited

U.S. PATENT DOCUMENTS

| | | |
|---|---|---|
| 3,173,788 | 3/1965 | Wimmar et al. ............... 430/309 |
| 3,471,289 | 10/1969 | Herrick ........................ 430/302 |
| 3,586,504 | 6/1971 | Coates et al. ................. 430/326 |
| 3,637,384 | 1/1972 | Deutsch et al. ............... 430/302 |
| 3,645,732 | 2/1972 | Jones ............................ 430/166 |
| 4,028,111 | 6/1977 | Iwasaki et al. ................ 430/302 |
| 4,147,545 | 4/1979 | Rowe et al. ................... 430/309 |
| 4,467,027 | 8/1984 | Yamamoto et al. ............ 430/302 |
| 4,613,561 | 9/1986 | Lewis ............................ 430/326 |
| 4,670,372 | 6/1987 | Lewis et al. .................. 430/326 |

OTHER PUBLICATIONS

English Translation of West German Pat. No. 2,504,130, Fuji Photo., Published 8/1975, p. 1-22, 430-309.

*Primary Examiner*—Charles L. Bowers, Jr.
*Attorney, Agent, or Firm*—Felfe & Lynch

[57] ABSTRACT

High contrast, sensitivity and bath life is obtainable by the addition of inorganic salts, preferably a carbonate, to an aqueous alkali metal base containing a carboxylated surfactant. The preferred alkali metal bases are potassium hydroxide or sodium hydroxide. The carboxylated surfactants contemplated by the invention are those encompassed with the formula:

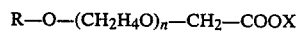

$$R-O-(CH_2H_4O)_n-CH_2-COOX$$

wherein R is a hydrocarbon radical of 6-18 carbon atoms alkyl radical, n has a value of 1-24 and X is a cation such as $K^+$, $Na^+$, or $H^+$. The gain in sensitivity with the incorporation of an inorganic compound furnishing ions, typically an inorganic salt, to the developer with the carboxylated surfactant compared to the sensitivity obtained with developers with carboxylated surfactant and inorganic salts omitted was typically two fold and greater without a corresponding film loss. Examples of salts are those that contain the anions $SO_4^{2-}$, $CO_3^{2-}$, $Cl^-$, $PO_4^{3-}$, $Br^-$, $NO_3^-$, borates or silicates and the cations $K^+$, $Na^+$, $Ca^{2+}$, $Mg^{2+}$, $Li^+$, or $H^+$. Additionally, reagents capable of generating these anions and cations in solution are applicable provided that no substantial change in pH of the developer solution results. The extended bath life which is obtainable with the incorporation of the carboxylated surfactant is not adversely affected by the addition of the inorganic salts in the surfactant-containing developer compositions.

4 Claims, No Drawings

PROCESS OF USING HIGH CONTRAST PHOTORESIST DEVELOPER WITH ENHANCED SENSITIVITY TO FORM POSITIVE RESIST IMAGE

This application is a contination of application Ser. No. 756,206, filed July 18, 1985 abandoned.

FIELD OF THE INVENTION

This invention relates to the addition of carboxylated surfactants and inorganic salts to a potassium hydroxide solution as a means of obtaining high contrast and high sensitivity for the development of positive resist films, in particular, alkali soluble resin/diazo ketone photoresist. Contrast values (gamma) greater than 5 are obtainable with optical sensitivities less than 25 $mJ/cm^2$ while maintaining negligible film loss from unexposed resist.

CROSS REFERENCE TO RELATED APPLICATION

The present application is an improvement over the invention disclosed in the co-pending application of J. M. Lewis, et al. for "High Contrast Photoresist Developer", Serial No. 660,600 filed on Oct. 15, 1984 issued as U.S. Pat. No. 4,670,372 on June 2, 1987.

BACKGROUND OF THE INVENTION

Photoresists are polymer films which change their solubility response to a developer solution after the film has been exposed to an irradiation source, such as ultraviolet light or a beam of electrons or ions. As a consequence of the exposure, a different solubility rate results between the exposed and unexposed (masked over) portions of the photoresist film that yields a surface relief pattern after the development of the film.

Those photoresists which become more soluble in the exposed regions are referred to as positive acting. However, because the alteration of the solubility of the photoresist is only a relative change and even the less soluble unexposed portions of the photoresist dissolve to some extent, any process which enhances the developing rate difference (i.e. contrast) between the exposed relatively soluble and the unexposed, relatively insoluble photoresist portion is advantageous.

Positive photoresists are typically comprised of an aqueous alkaline soluble resin, such as novolac resin or poly (p-hydroxystyrene), and a diazonaphthoquinone sulfonic acid ester sensitizer. The resin and sensitizer may be applied by a method such as spin coating from an organic solvent or solvent mixture onto a substrate, such as silicon wafers and chrome plated glass plates. Developers that have been used to process the positive photoresists are aqueous alkaline solutions such as sodium silicate, potassium hydroxide, sodium hydroxide, tetramethyl ammonium hydroxide and ammonium hydroxide. Various salts have been added to the developers in order to increase the sensitivity of the resist. These salts include sodium phosphate, sodium borate, sodium carbonate, and sodium silicate. The addition of the corresponding acid will generate the salt in the developer, so the sodium cation is not a specific requirement. However, no improvement in contrast or resolution capability is realized.

The majority of existing positive photoresist systems can have a maximum contrast value (gamma) of three (3) to five (5) depending upon the processing condition. The problems associated with gammas of this order are evident in the reported performance. Typically, gammas of this order are obtained by using a weak developer and prolonged developing time with an attendant loss of throughput.

Gammas of greater than 5 have been achieved through the addition of certain surfactants to the developer. Quaternary ammonium surfactants increase the contrast of tetramethyl ammonium hydroxide developers and fluorocarbon nonionic surfactants increase the contrast in alkaline hydroxide, i.e. NaOH and KOH developers. These surfactants provide the high contrast, but the developer life is limited for repeated dip developing processes. Typically, the surfactant effect is greatly diminished after the first material has been developed with a resulting change in the exposure required. These developers lend themselves well to spray developing processes in which the developer is continuously replenished or used once and discarded as in a puddle process. A positive photoresist aqueous base developer that gives high contrast, high sensitivity and a stable bath life is desirable. The gamma obtained should be greater than five (5); the sensitivity, better than 40 $mJ/cm^2$; and the bath life, greater than 400 wafers developed per gallon of developer.

The high contrast provides line-width control and process latitude in photoresist imaging. The high sensitivity allows for high throughput of wafers on the exposure tool. The long bath life provides a large number of substrates to be processed before changing the developer bath which reduces the cost of using the developer in terms of time and economics.

The line-width control is important in cases where fine lines are to be defined in the resist that covers steps or topography on the coated substrate. The linewidth of the patterned resist geometries change in dimension as the line crosses the step. The higher the contrast of the resist, the less the effect on dimensional change crossing a step. The process latitude afforded by the high contrast is a result of the ability to over-develop the exposed resist without affecting the unexposed resist in the adjacent areas. As a result, extremely small geometries of less than one micrometer can be patterned and the resist processing is less susceptible to change in conditions, such as exposure.

The high sensitivity is important to the throughput of the patterning process. The shorter the exposure time required, the more substrates can be processed through a given exposure tool in a given time. This feature is particularly important for direct write operations such as electron beam and ion beam lithography where throughput is critically dependent on the sensitivity of the resist system. For photolithography, the high sensitivity will allow setting the optics of the exposure tool to provide the best image quality. Finer lines can be patterned with smaller apertures which reduces the exposure level without sacrificing the throughput of an exposure tool. This is critical in projection aligners that project the image through a lens system onto the substrate.

High contrast developers can change after the first batch is processed. The changes are observed as a change in sensitivity and the corresponding change in the linewidth of the patterns. These changes prove to be detrimental to the linewidth control.

Accordingly, a need exists for an improved developer which provides superior contrast and the effectiveness of which does not change significantly as subsequent batches of substrates are developed; to the extent that of the order of more than an equivalent of 400 silicon wafers 100mm in diameter can be developed in four (4) liters of developer.

SUMMARY OF THE INVENTION

This invention is applicable to lithographic exposures utilizing photons, electrons and ions. Specifically, as a result of the improved sensitivity, higher throughput during lithographic processing for the fabrication of semiconductor devices and photomasks is realized. The developer of the invention affords a higher resolution capability of less than one micron on projection exposure systems where the image is somewhat defocussed, i.e. with the higher contrast, smaller geometry dimensions can be patterned in the resist. In addition, the invention provides resist performance that is stable over the life of the developer bath when used as an immersion developer.

The high contrast, sensitivity and bath life is obtainable in accordance with the invention by the addition of inorganic compound(s) usually an inorganic salt which furnishes ions, e.g. potassium carbonate, to an aqueous alkali metal base containing a carboxylated surfactant. The preferred alkali metal bases are potassium hydroxide or sodium hydroxide. The carboxylated surfactants contemplated by the invention are those encompassed within the formula:

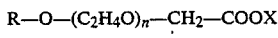

$$R\mathrm{-O-}(C_2H_4O)_n\mathrm{-CH_2-COOX}$$

wherein R is a 6-18 carbon atom alkyl radical, n has a value of 1-24 and x is a cation such as $K^+$, $Na^+$, or $H^+$. The incorporation of the carboxylated surfactant as described in detail in the above-referenced co-pending application, Ser. No. 660,600 yields a most practical improvement in contrast to the photoresist developer. The gain in sensitivity with the incorporation of inorganic compounds furnishing ions, most generally an inorganic salt, to the developer together with the carboxylated surfactant, in accordance with the discovery of the present invention, compared to the sensitivity obtained with developers with carboxylated surfactant where the inorganic salt is omitted was typically two fold and greater without a corresponding film loss. Any inorganic salt which dissociates in the aqueous medium and furnishes anion and cations, may be employed to enhance the sensitivity in accordance with the invention. Of the typical salts which may be used in the invention are those that contain the anions $SO_4^{2-}$, $CO_3^{2-}$, $Cl^-$, $PO_4^{3-}$, $Br^-$, $NO_3^-$, borates or silicates in combination with the cations $K^+$, $Na^+$, $Ca^{2+}$, $Mg^{2+}$, $Li^+$ or $H^+$. Typical salts include potassium carbonate, potassium chloride, sodium carbonate, calcium chloride sodium sulfate, potassium phosphate, potassium bromide, magnesium nitrate, potassium borate, sodium silicate, lithium chloride, sodium bicarbonate, carbonic acid, and the like. Additionally, reagents capable of generating these anions and cations in solution are applicable provided that no substantial change in pH of the developer solution results. For example, this may be effected by bubbling $CO_2$ through an aqueous developer solution to thereby generate $CO_3^{2-}$ anions. The length of the bath life as a consequence of the additional incorporation of the inorganic salt with the carboxylated surfactant in the developer does not interfere with the improved bath life obtainable with the carboxylated surfactant modified composition described in the said co-pending application, Ser. No. 660,600.

DESCRIPTION OF THE PREFERRED EMBODIMENT

The photoresists employed with the developer of the present invention are those sensitizer-resin compositions in which the exposed portions of the composition becomes more soluble upon exposure.

Suitable sensitizers used in positive photoresists of this kind are diazo ketones having diazo and keto groups at adjacent positions on the molecule, such as the quinonediazide sulfonic acid derivatives which are described in U.S. Pat. Nos. 2,958,599; 3,046,110; 3,046,114; 3,046,116; 3,046,118; 3,046,119; 3,046,121; 3,046,122; 3,046,123; 3,106,465; 3,138,983; 3,635;709; 3,711;285; 4,174,222 which are hereby incorporated by reference.

The photosensitizer acts to decrease the solubility of the resin. Upon irradiation the photosensitizer undergoes a chemical reaction to form a carboxylic acid which increases the rate of solubilization of the photoresist in the exposed areas.

Suitable alkali soluble resins may be employed in the positive photoresists. Those contemplated by this invention, for example, include the prepolymerized phenolic-aldehyde resins, e.g. phenol formaldehyde, which are known as novolac and are available commercially. Resins of this type are disclosed, for example, in U.S. Pat. Nos. 3,201,239; 3,868,254; 4,123,219 and 4,173,470, the disclosures of which are incorporated herein by reference. These phenolic-aldehyde resinous compounds must be soluble in organic solvents and aqueous alkaline solutions.

A number of phenolic compounds and aldehydes or aldehyde producing compounds will yield novolac resin through well-known synthesis. Phenolic compounds that may be used include, but not limited to, phenol, xylenol, cresol, resorcinol, napthol, hydroquinone, alkyl phenols and halogenated phenols. Illustrative of the aldehydes and aldehyde producing compounds that may be used, but not limited to, are formaldehyde, acetaldehyde, paraformaldehyde, formaline, acrolein, crotonaldehyde and furfural.

We have discovered in accordance with the invention that a very significant improvement in sensitivity of the developer can be obtained by the incorporation into the developer of certain inorganic salts together with the carboxylated surfactants described U.S. Pat. No. 4,670,372. In accordance with the invention, the addition of the inorganic salt to carboxylated surfactant modified developer that comprises an aqueous alkaline metal base, preferably potassium hydroxide, results in a substantial improvement in sensitivity without subsequent loss of contrast or duration of developer bath life. This improvement in performance is attained by a balance among the concentrations of the base, surfactant and salt since each will affect the contrast and/or sensitivity in a predictable manner. For example, increasing the base and/or salt concentration will result in enhanced sensitivity up to a practical limit as defined by that point where film loss becomes intolerable. The surfactant provides high contrast but with an accompanied reduction in speed of development. This reduction in sensitivity negates to some extent the increased sensitivity due to the presence of salt. However, the effect on developer performance of the carboxylated surfactant and salt individually are quite dramatic. This is most easily seen by comparison of the examples that illustrate the invention. For example, the presence of 83 ppm of carboxylated surfactant in a 0.2 N KOH solution will improve the contrast value (gamma) from 2 to 7 as shown in Examples 1 and 5, respectively. The addition of the surfactant causes a slight but noticeable loss in sensitivity from 20 mJ/cm$^2$ to 25 mJ/cm$^2$, but the unexposed resist film loss is reduced from 3% to no loss with surfactant-containing developer.

The addition of an inorganic salt such as potassium carbonate increased the sensitivity from 20 mJ/cm$^2$ to 12 mJ/cm$^2$ as shown by Examples 1 and 27 however, the film loss is greater, 7% vs. 3%, and there is no accompanying improvement in the contrast, both give gammas of 2. The addition of the salt to the surfactant-containing developers increased the sensitivity from 25 mJ/cm$^2$ to 7 mJ/cm$^2$ as shown by Examples 5 and 26 but without any increase in unexposed film loss, both have no loss, and the contrast remains high, both have gammas of 7. As with these and other examples, the combination of surfactant and inorganic salt gives increased sensitivity without sacrificing contrast and unexposed resist.

Of the several salts which may be employed, we have found that carbonates may be advantageously used, potassium carbonate is preferred although other carbonates such as sodium carbonate, lithium carbonate, etc. may be employed. Additionally, either solid or gaseous carbon dioxide may be added directly to the developer to generate the carbonate directly in solution. Alternatively, salts containing the cations $K^+$, $Na^+$, $Mg^+$, $Li^+$, or $H^+$, and the anions $SO_4^{2-}$, $Cl^-$, $PO_4^{3-}$, $Br^-$, $NO_3$, borates or silicates may be employed.

In the developer system of the invention, the surfactants are those set forth in the above-referenced patent application, Ser. No. 660,600, i.e. those characterized by the formula R—O—$(C_2H_4$—O$)_n$CH$_2$COOX where R is a linear or branched hydrocarbon radical of 6 to 18 carbon atoms, n is an integer of 1 to 24, and X is $H^+$, $Na^+$, $K^+$, or any of a number of other cations and wherein R is, preferably, a linear chain of $C_{12}$ to $C_{15}$; n is preferably 5; and X is preferably the same cation as that of the alkaline base preferably potassium and such other examples provided in Application Ser. No. 660,600.

In using the developer, such as the potassium hydroxide developer, without the carboxylated surfactants and salts of the invention or surfactants other than the surfactants of the invention, e.g. Aerosol OS (0.005%) the contrast were 2.2 and 2.6 and sensitivities greater than 25 mJ/cm$^2$. In using the developer described in this invention wherein an ionfurnishing inorganic compound was also incorporated in the developer, contrast values greater than 5 were obtained with sensitivities of less than 25 mJ/cm$^2$ and typically less than 5 mJ/cm$^2$ with a bath life of greater than 400 wafers of 100 mm developed in one gallon of developer with no loss in photoresist performance.

The photoresist used in the comparison was a novolac resin with a diazonaphthoquinone sulfonic acid ester photosensitizer. The photoresist coating was prepared by spin coating. The substrates were silicon wafers typical of those used in the manufacture of semiconductor devices. These wafers were subjected to 200° C. dehydration bake followed by a precoating treatment with vapors of hexamethyldisilazane for 10 minutes at room temperature immediately prior to coating. The wafers were spun at a speed so as to provide a one micrometer thick film. The coated wafers were baked at 90° C. for 30 minutes in a forced air convection oven. After baking, the wafers were exposed to either ultraviolet radiation or an electron beam.

Photolithography consisted of exposing the coated wafer through an Opto-Line step tablet resolution mask with windows of various optical density so as to provide various exposure levels on the same wafer. The incident ultraviolet exposure was such as to provide a range of exposures through a step tablet mask from no exposure to exposure sufficient for the resist to develop to the substrate. Other techniques can be employed by those skilled in the art to obtain areas of wafers of known exposure levels for the purpose of evaluation.

Electron beam exposure was performed with an unmodified Perkin-Elmer Autoscan electron microscope under manual control. An acceleration voltage of 20 Kev was employed at a beam current of 6nA. The raster pattern of the electron beam was roughly that of a square with a length of ca. 20 micrometers on each side at a magnification of 3000× and a working distance of 12 mm; however, exposure across the rastered area was nonuniform. Relative changes in sensitivity were evaluated by comparison of the minimum exposure times required to completely clear the electron beam exposed pattern.

The increased sensitivity obtained with use of the invention for electron beam exposed resist is illustrated by comparison of Examples 28 and 29. Note that relative to the developer of the comparative example, the base concentration was decreased and the surfactant concentration was increased for the invention. Both changes would tend to decrease the overall sensitivity of the system. Nevertheless, an increase in sensitivity of a factor of 3 is obtained with the invention.

After exposure, the resist can be contacted with the developer composition of the invention by any suitable manner for known developers, such as immersion, spray and puddle techniques. The novel developer composition of the invention operates at a pH of at least 9 and preferably at a pH above about 10.5 and more preferably above 12. Following development, the workpiece can be rinsed with water and further processed in a conventional manner. The thickness of the photoresist remaining can be measured by any suitable method, such as interferometry, profilometry and elipsometry.

Amounts of carboxylated surfactant from about 0.0001% to about 1.0% by weight of the developer may be used with advantage. The more effective level of the carboxylated surfactant ranges from 0.005% to 0.5%. The preferred range is 0.01 to 0.1%. The concentration of potassium hydroxide must be varied accordingly to maintain the sensitivity level. The more surfactant, the more concentrated the developer needs to be, i.e. a decrease in sensitivity results as the surfactant concentration is increased. This effect is clearly demonstrated in the Examples that illustrate the invention. For example, for a 0.175 N solution of KOH containing 4% $K_2CO_3$ a decrease in sensitivity of ca. a factor of 2 results if the concentration of surfactant is increased from 120 ppm to 480 ppm (Examples 18 and 19). Amounts of inorganic salts from about 0.001% to about 20% of the developer in conjunction with the carboxylated surfactant may be used with advantage. The more effective level of the carbonate ranges from 0.1% to 15%. The preferred range is 1 percent to 10%. The concentrations of potassium hydroxide and carboxylated surfactant must be varied accordingly to obtain the desired or maximum sensitivity and contrast for a given carboxylated surfactant and carboxylated surfactant concentration. The more salt, the higher the sensitivity to a point at which the developer begins to attack the unexposed film. Comparison of Examples 19 and 20 shows this effect quite dramatically. For a 0.175 N solution of KOH containing 480 ppm of carboxylated surfactant the sensitivity is increased from 17 mj/cm$^2$ to 3 mJ/cm$^2$ as the $K_2CO_3$ concentration is increased from 4% to 8%. However, a resultant increase in film loss from zero to 1% is also encountered.

The alkali metal bases in addition to KOH include NaOH, LiOH, sodium silicate and the like, or compounds which when dissolved in the aqueous developer are capable of providing the equivalent ionic basicity of potassium hydroxide. When using sodium silicate, for example, the ratio of $Na_2O$ to $SiO_2$ is preferably from 1:1 to 3:1. The amount of alkali metal hydroxide, e.g. when using KOH may vary from about 0.1% to about 10% and preferably in the range of 0.5% to 5%. In addition to potassium carbonate, applicable salts include those that contain the anions $CO_3^{2-}$, $PO_4^{3-}$, $SO_4^{-2}$, $Cl^-$, $Br^-$, $NO_3^-$, borates or silicates and the cations $K^+$, $Na^+$, $Mg^{2+}$, $Li^+$, or $H^+$. Reagents capable of generating these ionic species in solution are appropriate provided that the concentration of the base is properly compensated for the amount of base that is neutralized. The amount of salt, e.g. when using the potassium carbonate may vary from 0.1% to about 20% and preferably in the range of 1% to 10%. Concentrations expressed as ppm or percentage values are by weight of the resulting developer solution.

The following examples are provided to illustrate the invention further. The enumeration of details in the examples should not be interpreted as limitations except as may be expressed in the appended claims. Parts expressed unless otherwise specifically indicated, are parts by weight based on the weight of the developer.

EXAMPLE 1

(Comparative)

A photoresist coating was prepared by spin coating a film from a solution of a novolac resin and the photosensitizer shown in formula 15 of Table I. The substrate are silicon wafers that had been subjected to a 300° C. dehydration bake for at least one minute on a hot plate, and then treated with hexamethyldisilazone vapors for 10 minutes at room temperature immediately prior to coating. The wafers were spun so as to provide a 1 micrometer ($\mu$m) thick film of the resin-photosensitive composition. The coated wafers were baked at 90° C. for 30 minutes in a forced air convection oven. After baking, the wafers were exposed to ultraviolet light through an Opto-Line step tablet resolution mask with windows of various optical density so as to provide various exposure levels on the same wafer. The incident exposure was such that a range of exposure from no exposure to exposure sufficient for the resist to develop to the substrate. A 0.200 N aqueous potassium hydroxide developer solution was prepared. The coated substrates were immersion developed at 22° C. for 60 seconds in this developer solution. The workpiece was rinsed in deionized water and dried. The contrast and sensitivity data are shown in Table II.

EXAMPLE 2

(Comparative)

A 0.250 N aqueous potassium hydroxide developer solution was prepared with 0.005% Aerosol OS (sodium isopropylnaphthalene sulfonate, a nonfluorinated surfactant available from American Cyanamid) added. Substrates were prepared as described in Example 1. The processed substrates were immersion developed at 22° C. for 60 seconds in this developer solution. The workpiece was rinsed with deionized water and dried. The contrast and sensitivity data are shown in Table II.

EXAMPLE 3

(Comparative)

A 0.200 N aqueous sodium hydroxide developer solution was prepared. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 4

(Comparative)

A 0.180 molar sodium metasilicate and 0.10 molar sodium phosphate aqueous developer solution was prepared. Substrates were prepared as described in Example 1. The processed substrates were immersion developed at 22° C. for 60 seconds in this developer. The workpiece was rinsed in deionized water and dried. The contrast and sensitivity data are shown in Table II.

EXAMPLE 5

(Comparative)

A 0.200 N aqueous potassium hydroxide developer solution was prepared with 83 ppm of a surfactant mixture of R—O($C_2H_4O$)$_5$ $CH_2$—COOX in which R is a linear hydrocarbon radical in the range of $C_{12}H_{25}$ to $C_{15}H_{31}$ and X is $H^+$. Substrates were prepared as described in Example 1. The processed substrates were immersion developed at 22° C. for 60 seconds in this developer solution. The workpiece was rinsed in deionized water and dried. The contrast and sensitivity data are presented in Table II.

EXAMPLE 6

(Comparative)

A 0.200 N aqueous sodium hydroxide developer solution was prepared with 83 ppm of the surfactant used in Example 5 added. Substrates were prepared as described in Example 1. The processed substrates are immersion developed at 22° C. for 60 seconds in this developer solution. The workpiece was rinsed in deionized water and dried. The contrast and sensitivity data are shown in Table II.

EXAMPLE 7

(Comparative)

A 0.180 molar sodium metasilicate and 0.100 molar sodium phosphate aqueous developer solution was prepared with 83 ppm of the surfactant used in Example 5 added. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 8
(Comparative)

A 0.200 N aqueous potassium hydroxide developer solution was prepared with 80 ppm of a surfactant mixture of R—O($C_2H_4O$)$_5$CH$_2$—COQH in which R is a branched hydrocarbon radical in the range of $C_{12}H_{25}$ to $C_{15}H_{31}$. Substrates were prepared as described in Example 1. The processed substrates were immersion developed at 22° C. for 60 seconds in this developer solution. The workpiece was rinsed in deionized water and dried. The contrast and sensitivity data obtained are presented in Table II.

EXAMPLE 9
(Comparative)

A 0.200 N aqueous sodium hydroxide developer solution was prepared with 80 ppm of the surfactant used in Example 8. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 10
(Comparative)

A 0.200 N aqueous potassium hydroxide developer solution was prepared with 80 ppm of surfactant of Formula $C_2H_5$—O—($C_2H_4O$)$_4$CH$_2$—COOH. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 11
(Comparative)

A 0.200 N aqueous potassium hydroxide developer solution was prepared with 80 ppm of surfactant of Formula $C_4H_9$O-($C_2H_4O$)$_4$—CH$_2$—COOH. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 12
(Comparative)

A 0.200 N aqueous potassium hydroxide developer solution was prepared with 80 ppm of surfactant of Formula $C_{13}H_{27}$O—($C_2H_4O$)$_{18}$—CH$_2$—COOH. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 13
(Comparative)

A 0.200 N aqueous potassium hydroxide developer solution was prepared with 80 ppm of surfactant of Formula (i—$C_{18}H_{37}$)—O—($C_2H_4O$)$_5$CH$_2$—COOH. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 14
(Comparative)

A 0.126 N aqueous sodium hydroxide and 0.271 N sodium borate developer solution was prepared. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 15
(Comparative)

A 0.126 N aqueous sodium hydroxide and 0.271 N sodium borate developer solution was prepared with 83 ppm of the surfactant in Example 5 added. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 16

A 0.200 N aqueous potassium hydroxide developer solution was prepared with 80 ppm of surfactant as in Example 5 and 1% potassium chloride added. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 17

A 0.175 N aqueous potassium hydroxide developer solution was prepared with 102 ppm of surfactant as in Example 15 and 2% potassium carbonate added. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 18

A 0.175 N aqueous potassium hydroxide developer solution was prepared with 120 ppm of surfactant as in Example 15 and 4% potassium carbonate added. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 19

A 0.175 N aqueous potassium hydroxide developer solution was prepared with 480 ppm of surfactant as in Example 15 and 4% potassium carbonate added. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 20

A 0.175 N aqueous potassium hydroxide developer solution was prepared with 480 ppm of surfactant as in Example 15 and 8% potassium carbonate added. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 21

A 0.150 N aqueous potassium hydroxide developer solution was prepared with 60 ppm of surfactant as in Example 15 and 2% potassium carbonate added. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 22

A 0.150 N aqueous potassium hydroxide developer solution was prepared with 60 ppm of surfactant as in Example 15 and 0.5% potassium carbonate added. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 23

A 0.175 N aqueous potassium hydroxide developer solution was prepared with 240 ppm of surfactant as in Example 15 and 4% potassium carbonate added. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 24

A 0.200 N aqueous potassium hydroxide developer solution was prepared with 480 ppm of surfactant as in Example 15 and 4% potassium carbonate added. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 25

A 0.200 N aqueous potassium hydroxide developer solution was prepared with 240 ppm of surfactant as in Example 15 and 2% potassium carbonate added. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 26

A 0.200 N aqueous potassium hydroxide developer solution was prepared with 120 ppm of surfactant as in Example 15 and 2% potassium carbonate added. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 27

(Comparative)

A 0.200 N aqueous potassium hydroxide developer solution was prepared with 0.5% potassium carbonate added. Substrates were prepared as described in Example 1. The processed substrates were immersion developed at 22° C. for 60 seconds in this developer solution. The workpiece was rinsed in deionized water and dried. The contrast and sensitivity data are shown in Table II.

EXAMPLE 28

(Comparative)

A resist coating was prepared as described in Example 1. The sample was exposed to 6nA electron beam for 90 seconds. Development of the electron beam generated pattern was effected with 0.200 N potassium hydroxide solution with 80 ppm of the surfactant of Example 15. A pattern was produced as viewed through a scanning electron microscope. The absolute sensitivity and contrast were not determined. The sensitivity expressed in terms of Exposure Time is set forth in Table II.

EXAMPLE 29

A resist coating was prepared as described in Example 1. The sample was exposed to a 6nA electron beam for less than 30 seconds. Development of the electron beam generated pattern was effected with 0.150 N potassium hydroxide solution with 120 ppm of the surfactant as in Example 5 and 6% potassium carbonate as the developer. The pattern produced was similar to that obtained in Example 30. The sensitivity in terms of Exposure Time is set forth in Table II.

TABLE II

| EXAMPLE | BASE | SURFACTANT/ SALT | SENS. (mJ/cm$^2$) | CONTRAST (gamma) | FILM LOSS % |
|---|---|---|---|---|---|
| 1 | KOH (0.20 N) | None | 20 | 2 | 3 |
| 2 | KOH (0.25 N) | Sodium isopropyl Napthaline 0.005% | 25 | 3 | 3 |
| 3 | NaOH (0.20 N) | None | 14 | 1.5 | 8 |
| 4 | Na$_2$SiO$_3$ (0.18 M)/ Na$_3$PO$_4$ (0.1 M) | None | 22 | 1.5 | 3 |
| 5 | KOH (0.20 N) | R—O—(C$_2$H$_4$O)$_5$—CH$_2$COOH (R=linear C$_{12}$H$_{25}$ to C$_{15}$H$_{31}$) 80 ppm | 25 | 7 | 0 |
| 6 | NaOH (0.20 N) | Same as Example 5 | 18 | 6 | 0 |
| 7 | Na$_2$SiO$_3$ (0.18 M)/ Na$_3$PO$_4$ (0.10 M) | Same as Example 5 | 25 | 5 | 0 |
| 8 | KOH (0.20 N) | R—O—(C$_2$H$_4$O)$_5$—CH$_2$—COOH | 35 | 8 | 0 |

TABLE II-continued

| EXAMPLE | BASE | SURFACTANT/SALT | SENS. (mJ/cm$^2$) | CONTRAST (gamma) | FILM LOSS % |
|---|---|---|---|---|---|
| | | (R=branched $C_{12}H_{25}$ to $C_{15}H_{31}$) 80 ppm | | | |
| 9 | NaOH (0.20 N) | See Example 8 | 18 | 6 | 0 |
| 10 | KOH (0.20 N) | $C_2H_5$—O—$(C_2H_4O)_4$—COOH 80 ppm | 100 | >10 | 0 |
| 11 | KOH (0.20 N) | $C_4H_9$—O—$(C_2H_4O)_4$—COOH 80 ppm | 100 | >10 | 0 |
| 12 | KOH (0.20 N) | $C_{13}H_{27}$—O—$(C_2H_4O)_4$—COOH 80 ppm | 50 | >10 | 0 |
| 13 | KOH (0.20 N) | $(i\text{-}C_{18}H_{37})$—O—$(C_2H_4)_5$—COOH 80 ppm | 32 | 10 | 0 |
| 14 | NaOH (0.126 N)/ $Na_3BO_3$ (0.271.N) | None | 22 | 2 | 1 |
| 15 | NaOH (0.126 N)/ $Na_3BO_3$ (0.271 N) | See Example 5 | 30 | 4 | 0 |
| 16 | KOH (0.200 N) | See Example 5; 80 ppm; KCl 1% | 9 | 5 | 0 |
| 17 | KOH (0.175 N) | See Example 5; 102 ppm $K_2CO_3$ 2% | 15 | 5 | 0 |
| 18 | KOH (0.175 N) | See Example 5; 120 ppm $K_2CO_3$ 4% | 8 | 3 | 0 |
| 19 | KOH (0.175 N) | See Example 5; 480 ppm $K_2CO_3$ 4% | 17 | 5 | 0 |
| 20 | KOH (0.175 N) | See Example 5; 480 ppm $K_2CO_3$ 8% | 3 | 2 | 1 |
| 21 | KOH (0.150 N) | See Example 5; 60 ppm $K_2CO_3$ 2% | 18 | 5 | 0 |
| 22 | KOH (0.150 N) | See Example 5; 60 ppm $K_2CO_3$ 0.5% | 30* | 6 | 0 |
| 23 | KOH (0.175 N) | See Example 5; 240 ppm $K_2CO_3$ 4% | 10 | 5 | 0 |
| 24 | KOH (0.200 N) | See Example 5; 480 ppm $K_2CO_3$ 4% | 6 | 5 | 0 |
| 25 | KOH (0.200 N) | See Example 5; 240 ppm $K_2CO_3$ 2% | 10 | 7 | 0 |
| 26 | KOH (0.200 N) | See Example 5; 120 ppm $K_2CO_3$ 2% | 7 | 7 | 0 |
| 27 | KOH (0.200 N) | None $K_2CO_3$ 0.5% | 12 | 2 | 13 |
| 28 | KOH (0.200 N) | See Example 5; 80 ppm | 90 sec** | clears | 0 |
| 29 | KOH (0.150 N) | See Example 5; 120 ppm $K_2CO_3$ 6% | 30 sec** | clears | 0 |

*shows improvement with relatively low amount of salt compared to Example 21.
**given in terms of exposure time Exposure time related to sensitivity

What is claimed is:

1. In a process for developing a positive photoresist pattern on a radiation sensitive positive resist film formed of a photosensitive mixture of quinone diazide sulfonic acid derivatives with an alkali soluble resin, coated on a substrate and exposed to sufficient patterned radiation to expose the film whereafter the film is developed by dissolving the exposed parts in an alkaline developer to form the surface relief pattern, the improvement wherein high contrast is attained without increasing unexposed film loss by developing the film with an aqueous alkaline developer solution having a pH of at least 9 and comprising:

a solution of the following ingredients which are separate ingredients in solution,
(a) a sufficient amount of alkali metal base which with the other ingredients enables the developer solution to maintain a pH of at least 9;
(b) at least 0.0001% based on the weight of the developer, of a carboxylated surfactant selected from those of the formula:

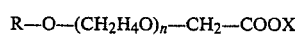

R—O—$(CH_2H_4O)_n$—$CH_2$—COOX where R is a linear or branched hydrocarbon radical of 6–18 carbon atoms, n is an integer of 1 to 24 and X is selected from the group consisting of H$^+$, Na$^+$, K$^+$; and
(c) from about 0.01% to about 20% based on the weight of the developer, of an inorganic compound furnishing ions.

2. The process of claim 1 wherein the carboxylated surfactant is present in the range of 0.001% to 0.5% based on the total weight of the developer and the inorganic salt is present in amounts of from about 0.1% to 15% by weight of the developer.

3. In a process for developing a positive photoresist pattern on a radiation sensitive positive resist film formed of a photosensitive mixture of quinone diazide sulfonic acid derivatives with an alkali soluble resin, coated on a substrate and exposed to sufficient patterned radiation to expose the film whereafter the film is developed by dissolving the exposed parts in an alkaline developer to form the surface relief pattern, the improvement wherein high contrast is attained without increasing expected film loss by developing the film with an aqueous alkaline developer solution having a pH of at least 9 and comprising: a solution of the following ingredients which are separate ingredients in solution, (a) a sufficient amount of alkali metal base which with the other ingredients enables the developer solution to maintain a pH of at least 9;

(b) at least 0.0001% based on the weight of the developer, of a carboxylated surfactant selected from those of the formula:

$$R-O-(CH_2H_4O)_n-CH_2-COOX$$

where R is a linear or branched hydrocarbon radical of 6–18 carbon atoms, n is an integer of 1 to 24 and X is selected from the group consisting of $H^+$, $Na^+$, $K^+$; and (c) from about 0.01% to about 20% based on the weight of the developer of an inorganic salt of an anion selected from the group consisting of $SO_4^{2-}$, $CO_3^{2-}$, $Cl^-$, $PO_4^{3-}$, $Br^-$, $NO_3^-$, borates and silicates and a cation selected from the group consisting of $K^+$, $Na^+$, $Ca^{++}$, $Mg^{++}$, $Li^+$, and $H^+$.

4. The process of claim 3 in which the carboxylated surfactant is present in the range of 0.001% to 0.5% based on the total weight of the developer and the inorganic salt is present in amounts of from about 0.1% to 15% by weight of the developer.

* * * * *

UNITED STATES PATENT AND TRADEMARK OFFICE
CERTIFICATE OF CORRECTION

PATENT NO. : 4,822,722
DATED : April 18, 1989
INVENTOR(S) : Lewis et al.

It is certified that error appears in the above-identified patent and that said Letters Patent is hereby corrected as shown below:

Column 16, line 22, add Claim 5:

--The process of claim 3 wherein the inorganic salt is potassium carbonate.--

Signed and Sealed this

Twenty-third Day of April, 1991

Attest:

HARRY F. MANBECK, JR.

Attesting Officer

Commissioner of Patents and Trademarks